(12) United States Patent
Newcomb et al.

(10) Patent No.: US 12,385,619 B1
(45) Date of Patent: Aug. 12, 2025

(54) LIGHTING DEVICE FOR A VEHICLE

(71) Applicant: GM GLOBAL TECHNOLOGY OPERATIONS LLC, Detroit, MI (US)

(72) Inventors: Bradley Allen Newcomb, Troy, MI (US); Jonglee Park, Novi, MI (US); Julien P. Mourou, Bloomfield Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 18/662,009

(22) Filed: May 13, 2024

(51) Int. Cl.
| | | |
|---|---|---|
| *F21S 43/14* | (2018.01) | |
| *B60J 1/18* | (2006.01) | |
| *B60Q 1/44* | (2006.01) | |
| *F21S 43/19* | (2018.01) | |
| *F21W 103/35* | (2018.01) | |
| *F21Y 107/50* | (2016.01) | |
| *F21Y 113/00* | (2016.01) | |
| *H10H 20/01* | (2025.01) | |
| *H10H 20/855* | (2025.01) | |
| *H10H 20/857* | (2025.01) | |

(52) U.S. Cl.
CPC ............... *F21S 43/14* (2018.01); *B60Q 1/44* (2013.01); *F21S 43/195* (2018.01); *H10H 20/855* (2025.01); *H10H 20/857* (2025.01); *B60J 1/18* (2013.01); *F21W 2103/35* (2018.01); *F21Y 2107/50* (2016.08); *F21Y 2113/00* (2013.01); *H10H 20/0363* (2025.01); *H10H 20/0364* (2025.01)

(58) Field of Classification Search
CPC ......... F21S 43/14; F21S 43/195; H01L 33/58; H01L 33/62; B60Q 1/44; H01H 20/855; H01H 20/857
See application file for complete search history.

(56) References Cited

U.S. PATENT DOCUMENTS

| | | | |
|---|---|---|---|
| 2008/0129204 A1 | 6/2008 | Tsukamoto et al. | |
| 2015/0109811 A1* | 4/2015 | Duhme | F21S 41/143 362/547 |
| 2022/0163183 A1* | 5/2022 | Mochimaru | F21S 43/16 |
| 2022/0185177 A1* | 6/2022 | Baker | B60Q 1/268 |

FOREIGN PATENT DOCUMENTS

| | | |
|---|---|---|
| DE | 19837553 A1 | 2/2000 |
| JP | H04372433 A | 12/1992 |
| JP | H086613 Y2 | 2/1996 |
| WO | 2016125261 A1 | 8/2016 |

OTHER PUBLICATIONS

German Office Action for German Application No. 102024119251.8; dated Jan. 17, 2025; 8 pages.

* cited by examiner

*Primary Examiner* — Thomas M Sember
(74) *Attorney, Agent, or Firm* — CANTOR COLBURN LLP

(57) ABSTRACT

Aspects of the disclosure include a vehicle having a glass disposed on the vehicle and a lighting device disposed within the glass, wherein the lighting device includes a plurality of light emitting diodes that are configured to emit light in a first direction, where the first direction is not normal to an outer surface of the glass.

20 Claims, 6 Drawing Sheets

LIGHTING DEVICE FOR A VEHICLE

INTRODUCTION

The subject disclosure relates to a lighting device for a vehicle, and particularly to a center high mounted stop lamp of a vehicle.

In general, a center high mounted stop lamp (CHMSL) is a red stop lamp that is mounted on the center of the rear of a vehicle. The CHMSL is generally located higher than the stop lamps located on the sides of a vehicle and is activated when the driver steps on the brake pedal and is off at other times. The purpose of a CHMSL is to safeguard the vehicle from being struck in the rear by another vehicle. In many jurisdictions, government regulations specify a minimum luminance of the CHMSL that must be observable from a specified location behind the vehicle.

SUMMARY

In one exemplary embodiment, a vehicle is provided. The vehicle includes a glass disposed on the vehicle and a lighting device disposed within the glass, wherein the lighting device includes a plurality of light emitting diodes that are configured to emit light in a first direction. The first direction is not normal to an outer surface of the glass.

In addition to the one or more features described herein the first direction is substantially parallel to a direction of travel of the vehicle.

In addition to the one or more features described herein the lighting device further includes one or more collimators disposed on one or more of the plurality of light emitting diodes.

In addition to the one or more features described herein the plurality of light emitting diodes are arranged in a two-dimensional array.

In addition to the one or more features described herein the lighting device further includes a substrate on which the plurality of light emitting diodes are disposed.

In addition to the one or more features described herein the lighting device further includes one or more structural fibers that are at least partially disposed on the substrate.

In addition to the one or more features described herein the substrate of the lighting device is formed into a stair step pattern.

In addition to the one or more features described herein a pitch of the stair step pattern is determined based on an angle of the glass.

In addition to the one or more features described herein the glass is formed by placing the lighting device in between an inner piece of glass and an outer piece of glass.

In addition to the one or more features described herein the glass is formed by placing the lighting device into a mold and encasing the lighting device in a transparent material that is injected into the mold.

In one exemplary embodiment, a lighting device for a vehicle is provided. The lighting device includes a substrate, a plurality of light emitting diodes disposed on the substrate, a contact pad configured to receive electrical power, and a plurality of electrical connections disposed within the substrate that are configured to transmit electrical power from the contact pad to the plurality of light emitting diodes. The plurality of light emitting diodes are configured to emit light in a first direction that is not normal to an outer surface of a back glass of the vehicle.

In addition to the one or more features described herein the lighting device also includes one or more structural fibers that are at least partially disposed on the substrate.

In addition to the one or more features described herein the substrate is formed into a stair step pattern.

In addition to the one or more features described herein a pitch of the stair step pattern is determined based on an angle of the back glass.

In addition to the one or more features described herein the first direction is substantially parallel to a direction of travel of the vehicle.

In addition to the one or more features described herein the lighting device also includes one or more collimators disposed on one or more of the plurality of light emitting diodes.

In another exemplary embodiment, a vehicle is provided. The vehicle includes a back glass disposed on the vehicle and a lighting device disposed within the back glass. The lighting device includes a substrate having a stair step shape, a plurality of light emitting diodes disposed on the substrate, one or more collimators disposed on one or more of the plurality of light emitting diodes, a contact pad configured to receive electrical power, and a plurality of electrical connections disposed within the substrate that are configured to transmit electrical power from the contact pad to the plurality of light emitting diodes. The plurality of light emitting diodes are configured to emit light in a first direction that is not normal to an outer surface of the back glass.

In addition to the one or more features described herein a pitch of the stair step shape is determined based on an angle of the back glass.

In addition to the one or more features described herein the lighting device also includes one or more structural fibers that are at least partially disposed on the substrate.

In addition to the one or more features described herein the back glass is formed by placing the lighting device in between an inner piece of glass and an outer piece of glass.

The above features and advantages, and other features and advantages of the disclosure are readily apparent from the following detailed description when taken in connection with the accompanying drawings.

BRIEF DESCRIPTION OF THE DRAWINGS

Other features, advantages, and details appear, by way of example only, in the following detailed description, the detailed description referring to the drawings in which.

DETAILED DESCRIPTION

Figure 1:
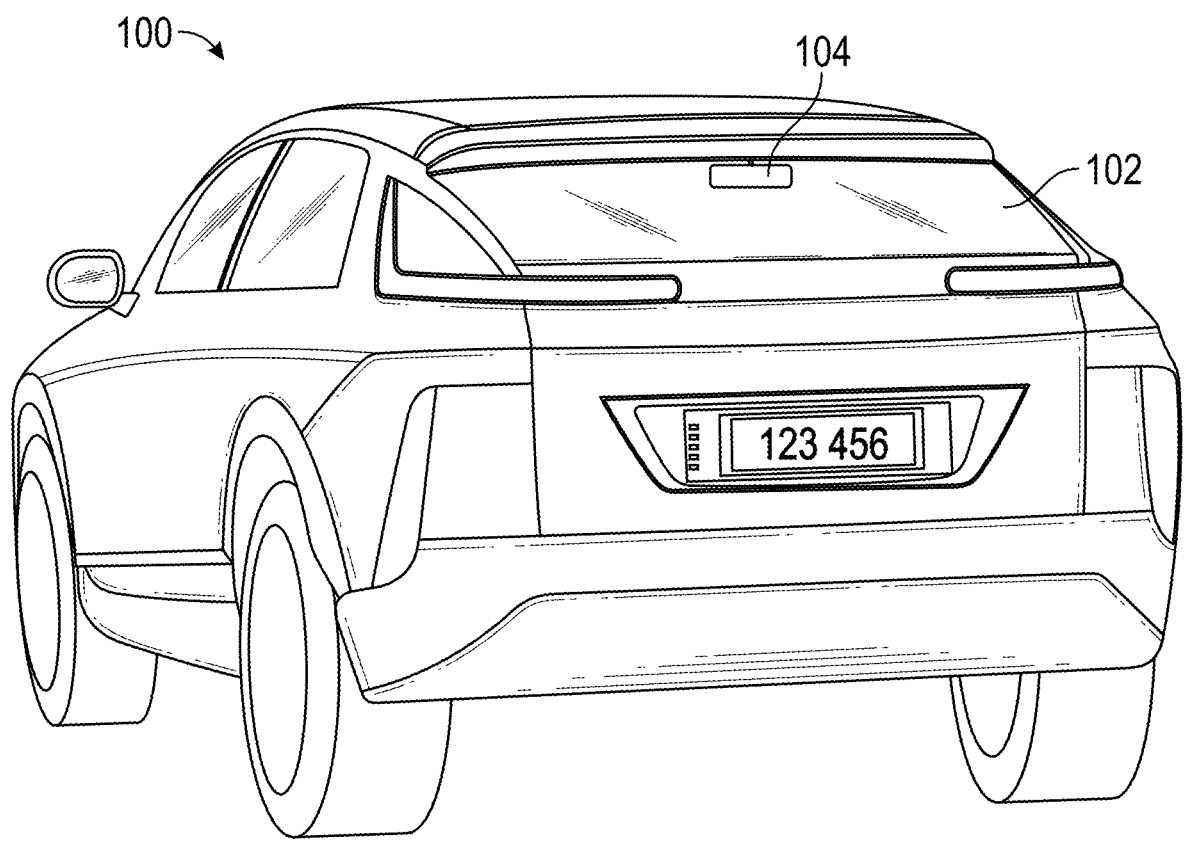
FIG. 1 is a vehicle configured in accordance with one or more embodiments.

The following description is merely exemplary in nature and is not intended to limit the present disclosure, its application or uses. It should be understood that throughout the drawings, corresponding reference numerals indicate like or corresponding parts and features.

Referring now to FIG. 1, a vehicle 100, in accordance with an exemplary embodiment is shown. The vehicle 100 includes a back glass 102 that is generally disposed on the rear of the vehicle 100. The back glass 102 includes a lighting device 104, also referred to herein as a center high mounted stop lamp (CHMSL) 104, that is disposed within the back glass 102. Often the back glass 102 of the vehicle is angled such that the back glass 102 is not perpendicular to the direction of travel of the vehicle. Traditionally, light emitted by a CHMSL 104 disposed on, or within, the back glass 102 is emitted in a direction that is normal to the surface of the back glass 102. As a result, the luminance of the light emitted by the CHMSL 104 that is observable directly behind the vehicle is only a fraction of the total luminance of the light emitted by the CHMSL 104. Accordingly, the total luminance of traditional CHMSLs 104 must substantially exceed the required minimum luminance of the CHMSL 104, which must be observable from a specified location behind the vehicle, in order to comply with the required minimum luminance of the CHMSL 104. In addition, as the angle of the back glass increases, the percentage of the light emitted by the CHMSL 104 that is observable directly behind the vehicle decreases.

Figure 2A:
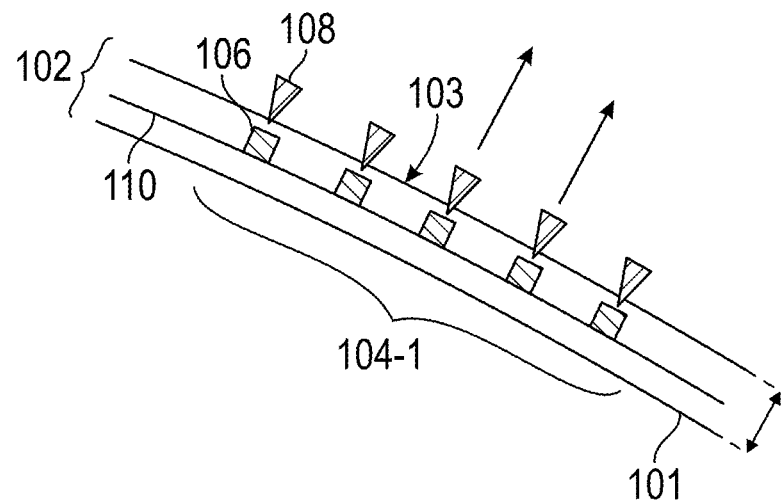
FIG. 2A is a cross-sectional view of a portion of a traditional center high mounted stop lamp.

Referring now to FIG. 2A, a cross-sectional view of a portion of a traditional center high mounted stop lamp is shown. As illustrated, the traditional center high mounted stop lamp 104-1 includes a substrate 110 that includes a plurality of light emitting diodes (LEDs) 106, such as mico-LEDs. The traditional center high mounted stop lamp 104-1 is disposed inside of the back glass 102, which includes an inner glass 101 and an outer glass 103. The LEDs 106 are disposed on the substrate 110 such that the light 108 emitted from the LEDs is substantially normal to the surface of the back glass 102.

Figure 2B:
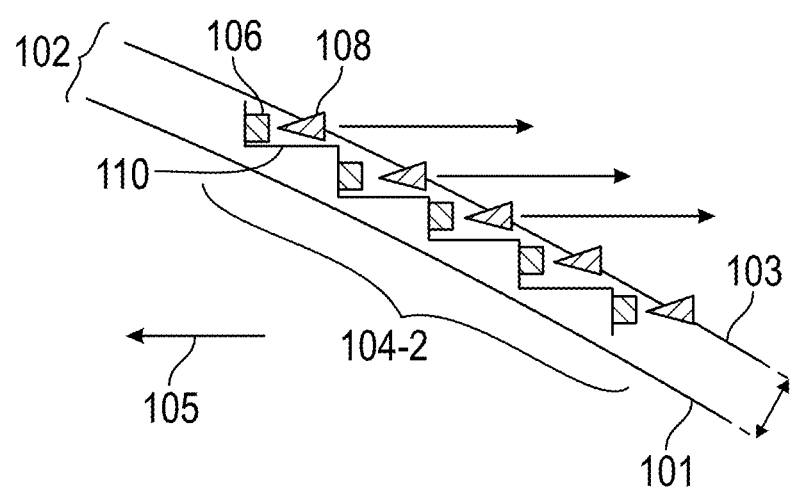
FIG. 2B is a cross-sectional view of a portion of a center high mounted stop lamp in accordance with one or more embodiments.

Referring now to FIG. 2B, a cross-sectional view of a portion of a center high mounted stop lamp in accordance with one or more embodiments is shown. As illustrated, the center high mounted stop lamp 104-2 includes a substrate 110 that includes a plurality of light emitting diodes (LEDs) 106, such as mico-LEDs. The center high mounted stop lamp 104-2 is disposed within a back glass 102 that includes an inner glass 101 and an outer glass 103. In exemplary embodiments, the substrate 110 is formed into a stair step pattern that has a pitch that is determined based at least in part on an angle of the back glass 102. In exemplary embodiments, the LEDs 106 are disposed on the substrate such that the light 108 emitted by the LEDs 106 is not normal to the surface of the back glass 102 and such that the light 108 emitted by the LEDs 106 is substantially parallel to a direction of travel 105 of a vehicle in which the CHMSL 104-2 is disposed.

In exemplary embodiments, the substrate 110 can be made of a range of suitable materials and will vary depending on the needs of the respective application (e.g., desired structural, thermal, and optical properties, etc.). In some embodiments, for example, the substrate 110 is made of one of glass, polycarbonate (PC) materials, acrylic materials such as polymethyl methacrylate (PMMA), thermoplastics such as thermoplastic polyurethane (TPU), glass-ceramic materials, such as soda-lime-silica glass-ceramics, aluminosilicate glass-ceramics, lithium aluminosilicate glass-ceramics, spinel glass-ceramics, and beta-quartz glass-ceramics, and combinations thereof.

Figure 3A:
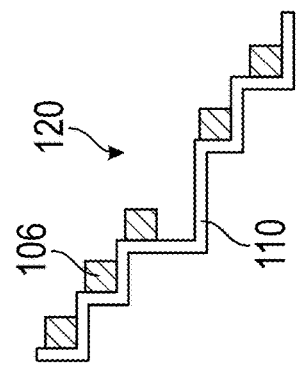
FIGS. 3A and 3B respectively illustrate a top view and a cross-sectional view of a light-emitting diode array used in forming a center high mounted stop lamp in accordance with one or more embodiments.
Figure 3B:
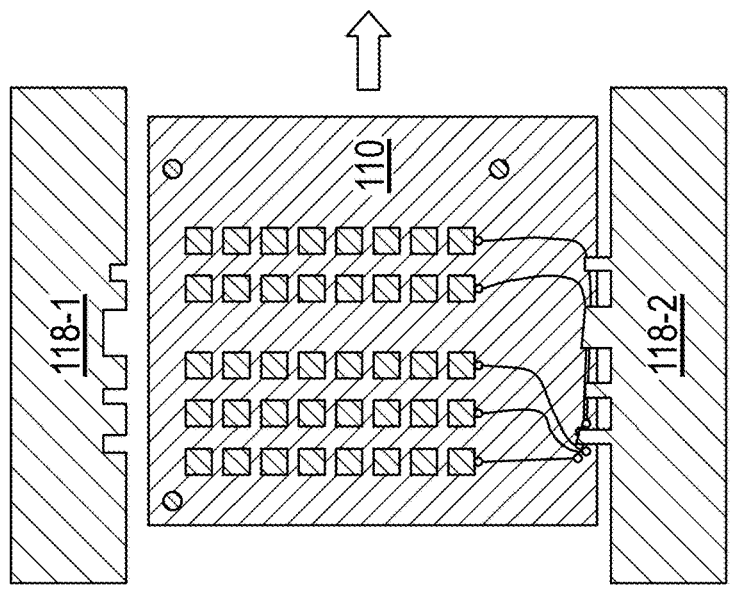

Referring now to FIGS. 3A and 3B, a top view and a side view of a light-emitting diode array used in forming a center high mounted stop lamp in accordance with one or more embodiments are respectively shown. The light-emitting diode array includes a plurality of LEDs 106 that are disposed on a substrate 110. The substrate 110 includes one or more contact pads 114 that are configured to receive electrical power and one or more electrical connections 116 that are configured to transmit electrical power from the contact pads 114 to the LEDs 106. In exemplary embodiments, the substrate 110 also includes one or more locating holes 112 that can be used to locate the substrate 110 during the forming of the CHMSL and/or during placement of the formed CHMSL. In exemplary embodiments, the one or more electrical connections 116 are at least partially disposed within the substrate 110.

Figure 3C:
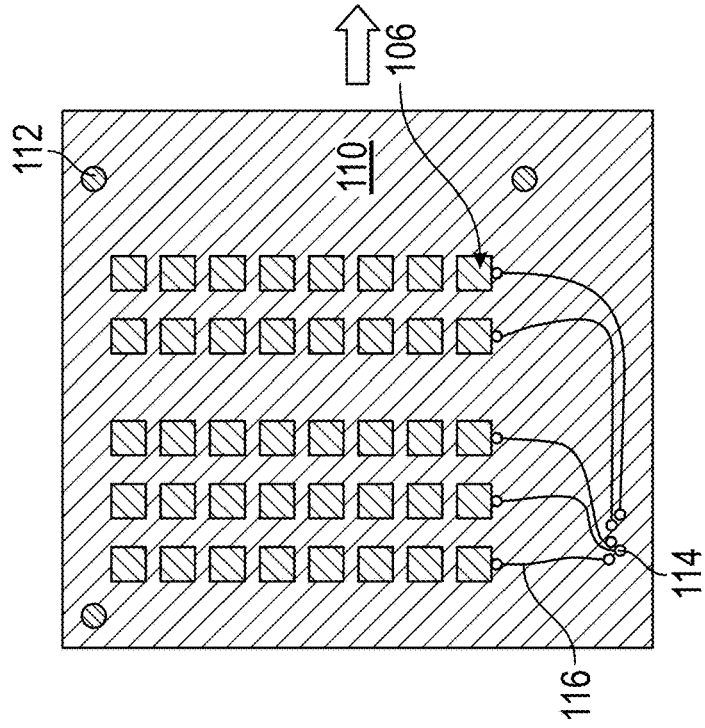
FIG. 3C is a cross-sectional view of a system for forming a center high mounted stop lamp in accordance with one or more embodiments.
Figure 3D:
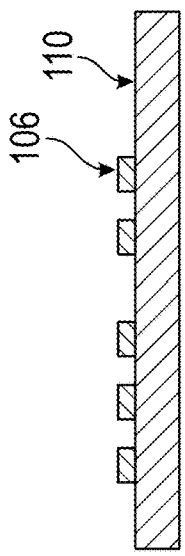
FIG. 3D is a cross-sectional view of a center high mounted stop lamp in accordance with one or more embodiments.

FIG. 3C illustrates a cross-sectional view of a system for forming a center high mounted stop lamp in accordance with one or more embodiments. In exemplary embodiments, the center high mounted stop lamp is formed by placing the substrate 110 into a press that includes a first mold 118-1 and a second mold 118-2. The substrate 110 is positioned between the first mold 118-1 and the second mold 118-2 and then pressed into a stair step shape to create a formed center high mounted stop lamp 120, as shown in FIG. 3D. In exemplary embodiments, one or more of the first mold 118-1, the second mold 118-2, and the substrate 110 may be heated before, or during, pressing on the substrate 110.

Figure 4D:
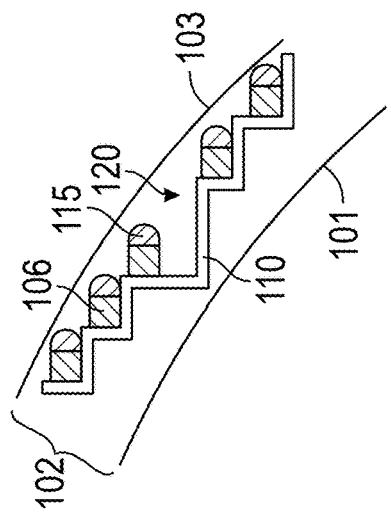
FIG. 4D is a cross-sectional view of a center high mounted stop lamp in accordance with one or more embodiments.
Figure 4C:
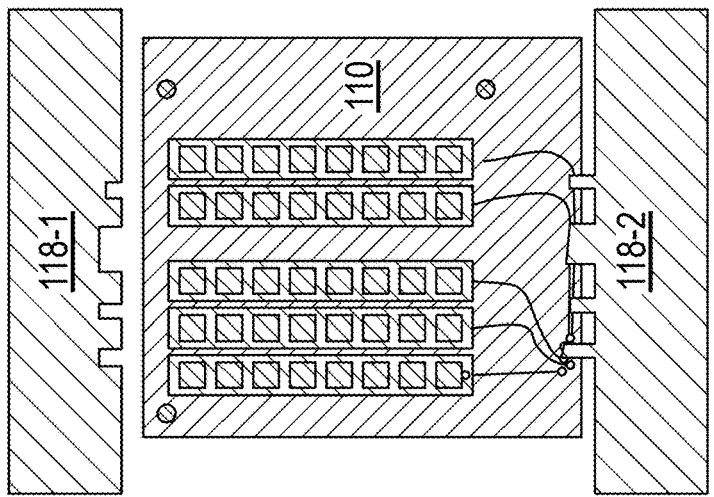
FIG. 4C is a cross-sectional view of a system for forming a center high mounted stop lamp in accordance with one or more embodiments.
Figure 4A:
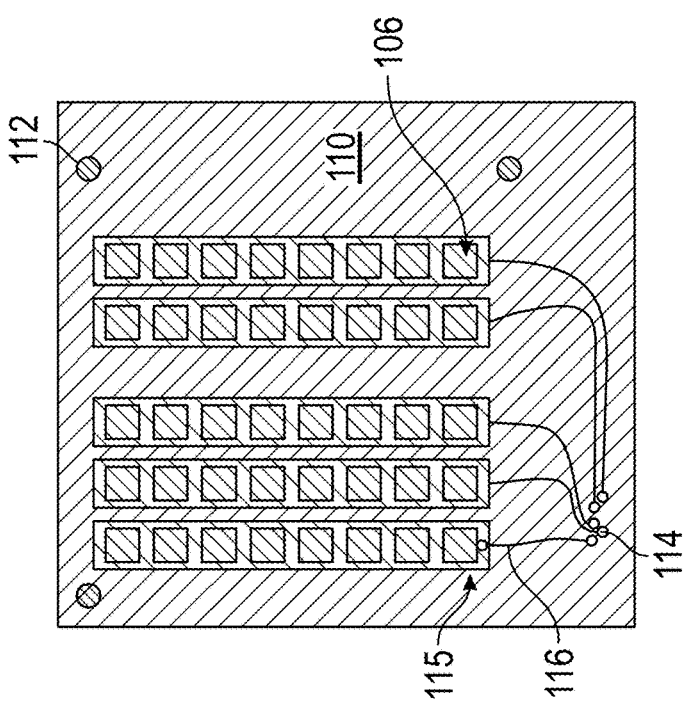
FIGS. 4A and 4B respectively illustrate a top view and a cross-sectional view of a light-emitting diode array used in forming a center high mounted stop lamp in accordance with one or more embodiments.
Figure 4B:
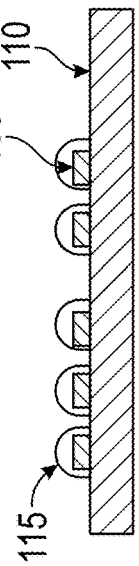

Referring now to FIGS. 4A and 4B, a top view and a side view of a light-emitting diode array used in forming a center high mounted stop lamp in accordance with one or more embodiments are respectively shown. The light-emitting diode array includes a plurality of LEDs 106 that are disposed on a substrate 110. The substrate 110 includes one or more contact pads 114 that are configured to receive electrical power and one or more electrical connections 116 that are configured to transmit electrical power from the contact pads 114 to the LEDs 106. In exemplary embodiments, the substrate 110 also includes one or more locating holes 112 that can be used to locate the substrate during forming of the CHMSL and/or during placement of the formed CHMSL.

In exemplary embodiments, the substrate 110 also includes one or more collimators 115 that are disposed on one or more of the LEDs 106. The collimator 115 is configured to narrow a beam of particles or waves emitted by the LEDs. As used here, to narrow can mean either to cause the direction to become more aligned in a specific direction, or to cause the spatial cross-section of the beam to become smaller. Although the illustrated embodiments depict a collimator 115 being disposed on each LED 106, in some embodiments, collimators 115 may only be disposed on a subset of the LEDs 106.

FIG. 4C illustrates a cross-sectional view of a system for forming a center high mounted stop lamp in accordance with one or more embodiments. In exemplary embodiments, the center high mounted stop lamp is formed by placing the substrate 110 into a press that includes a first mold 118-1 and a second mold 118-2. The substrate 110 is positioned between the first mold 118-1 and the second mold 118-2 and then pressed into a stair step shape to create a formed center high mounted stop lamp 120, as shown in FIG. 4D. In exemplary embodiments, the formed center high mounted stop lamp 120 is then disposed in the back glass 102 between an inner glass 101 and an outer glass 103.

In exemplary embodiments, the substrate 110 of formed center high mounted stop lamp 120 has a stair step shape. The pitch of the stair step shape of the substrate is determined based at least in part on an angle of the back glass 102 of the vehicle 100 in which the center high mounted stop lamp 120 will be installed. As user herein the pitch of the stair step shape is defined as a rise of the stair step shape divided by the length of the stair step shape.

Figure 5A:
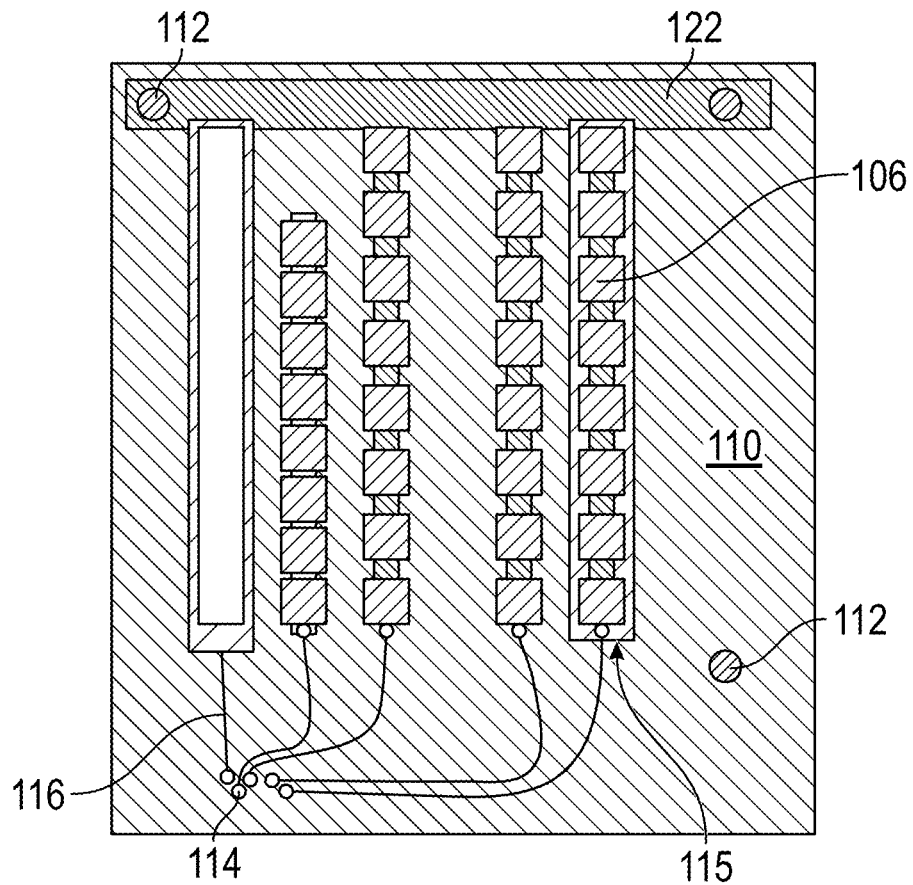
FIGS. 5A and 5B respectively illustrate a top view and a cross-sectional view of a light-emitting diode array used in forming a center high mounted stop lamp in accordance with one or more embodiments.
Figure 5B:
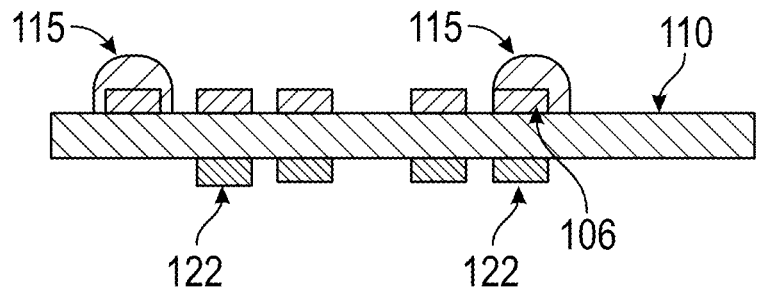

Referring now to FIGS. 5A and 5B, a top view and a side view of a light-emitting diode array used in forming a center high mounted stop lamp in accordance with one or more embodiments are respectively shown. The light-emitting diode array includes a plurality of LEDs 106 that are disposed on a substrate 110. The substrate 110 includes one or more contact pads 114 that are configured to receive electrical power and one or more electrical connections 116 that are configured to transmit electrical power from the contact pads 114 to the LEDs 106. In exemplary embodiments, the one or more electrical connections 116 are at least partially disposed within the substrate 110. In exemplary embodiments, the substrate 110 also includes one or more locating holes 112 that can be used to locate the substrate during forming of the CHMSL and/or during placement of the formed CHMSL.

In exemplary embodiments, the substrate 110 also includes one or more collimators 115 that are disposed on one or more of the LEDs 106. The collimator 115 is configured to narrow a beam of particles or waves emitted by the LEDs. In exemplary embodiments, the substrate 110 includes one or more structural fibers 122 that are at least partially disposed on the substrate 110. In one embodiment, the structural fibers 122 may include one or more of carbon fibers, polypropylene fibers, bast fibers, aramid fibers, and/or graphene. In one embodiment, the structural fibers 122 may be wove into the substrate 110. In another embodiment, as shown in FIG. 5B, the structural fibers 122 may be disposed on a surface of the substrate 110 opposite the surface that the LEDs 106 are disposed on. In exemplary embodiments, the structural fibers 122 may be disposed in a variety of patterns on the substrate 110.

Figure 6:
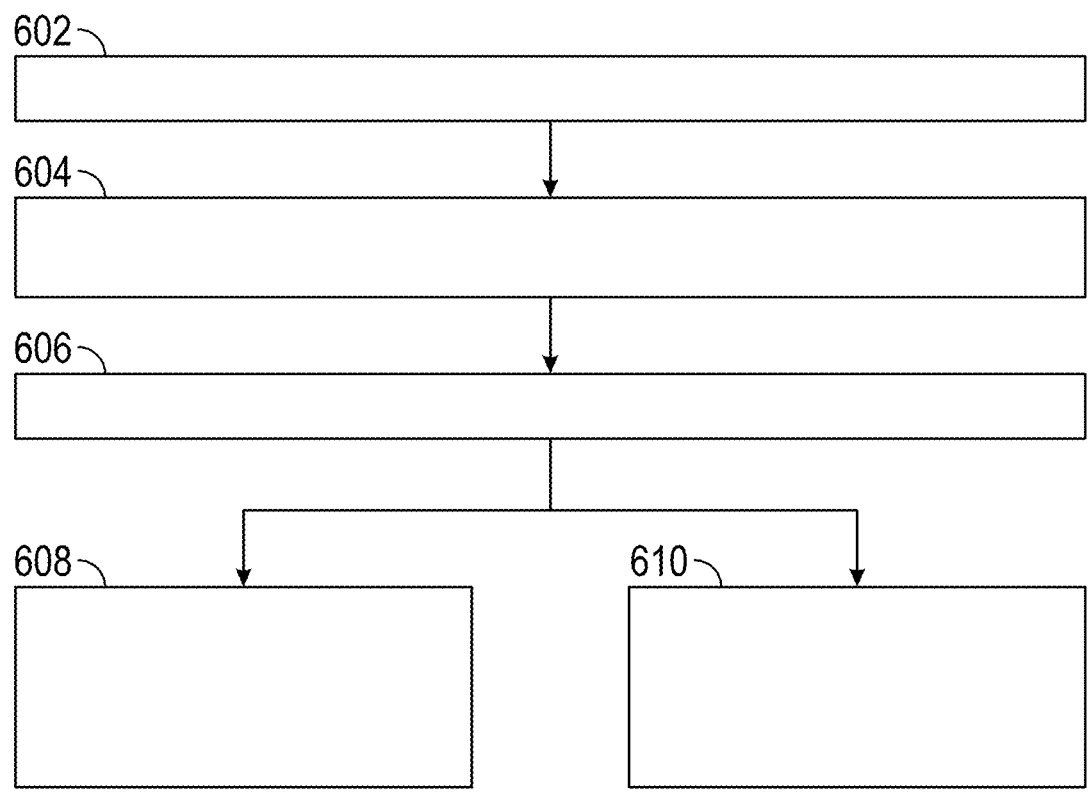
FIG. 6 is a flowchart of a method for forming a center high mounted stop lamp in accordance with one or more embodiments.

Referring now to FIG. 6, a flowchart of a method 600 for forming a center high mounted stop lamp according to an embodiment is shown. The method 600 is described in reference to FIGS. 1 to 5 and may include additional steps not depicted in FIG. 6. Although depicted in a particular order, the blocks depicted in FIG. 6 can be rearranged, subdivided, and/or combined.

At block 602, the method 600 includes placing a plurality of light emitting diodes on a substrate. In exemplary embodiments, the substrate includes one or more locating holes, one or more contact pads, and one or more electrical connections. The plurality of light emitting diodes may be disposed on the substrate in a two-dimensional array where the dimensions of the array are based on the desired illumination characteristics of the center high mounted stop lamp.

At block 604, the method 600 includes placing a collimator on one or more of the plurality of light emitting diodes on the substrate. In exemplary embodiments, the collimators are configured to control the direction and spread of the light emitted by the light emitting diodes.

At block 606, the method 600 includes pressing the substrate, with the light emitting diodes and collimator disposed thereon, into a stair stepped shape using one or more molds. In exemplary embodiments, the substrate may be heated before or while it is being pressed to increase the malleability of the substrate.

At block 608, the method 600 includes affixing the formed substrate between an inner glass and an outer glass to form a back glass for a vehicle. In exemplary embodiments, the locating holes on the substrate may be used to align and or affix the formed substrate to one of the inner glass and the outer glass.

At block 610, the method 600 includes inserting the formed substrate into a mold and encasing the formed substrate in a transparent material, such as a polycarbonate, a transparent thermoset, a polyamide, an acrylic, or the like. In one embodiment, the formed substrate, with the light emitting diodes and collimator disposed thereon, are encased in the transparent material by a process of injection molding the transparent material around the formed substrate. In exemplary embodiments, the substrate includes one or more structural fibers. The structural fibers may be embedded within the substrate, disposed on the surface of the substrate, or partially disposed on a surface of the substrate and partially disposed within the substrate (i.e., weaved into the substrate). In exemplary embodiments, the structural fibers are configured to ensure that the formed substrate maintains its shape during the injection molding process. In exemplary embodiments, the encased formed substrate may function as the back glass of the vehicle. In another embodiment, the encased formed substrate may be disposed between an inner glass and an outer glass to form the back glass for a vehicle.

In exemplary embodiments, a center high mounted stop lamp having a plurality of LED that are configured to emit light in a direction that is substantially parallel to the direction of travel of a vehicle and substantially not normal to a surface of a back glass of a vehicle is provided. By orienting the LEDs of the center high mounted stop lamp to emit light substantially parallel to the direction of travel of a vehicle the number of LEDs required to achieve a desired luminance directly behind the vehicle can be minimized. As a result, the energy consumed by the center high mounted stop lamp of the vehicle to achieve the desired luminance directly behind the vehicle can also be minimized.

Although the disclosure primarily refers to a center high mounted stop lamp disposed in the back glass of a vehicle, the disclosure is not intended to be limited to this configuration. Rather, the teachings herein may be applied to any lighting device that is disposed in the glass or polymer surface of a vehicle. In addition, the teaching herein may be utilized in other lighting applications.

The terms "a" and "an" do not denote a limitation of quantity, but rather denote the presence of at least one of the referenced item. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

When an element such as a layer, film, region, or substrate is referred to as being "on" another element, it can be directly on the other element or intervening elements may also be present. In contrast, when an element is referred to as being "directly on" another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this disclosure belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A vehicle comprising:
   a back glass disposed on a rear the vehicle, wherein the back glass is angled such that the back glass is not perpendicular to a direction of travel of the vehicle; and
   a lighting device disposed within the back glass between an inner piece of glass and an outer piece of glass that together form the back glass, wherein the lighting device includes a plurality of light emitting diodes that are configured to emit light in a first direction,
   wherein the first direction is not normal to an outer surface of the back glass,
   wherein the lighting device includes a substrate on which the plurality of light emitting diodes are disposed, and
   wherein the substrate of the lighting device is formed into a stair step pattern.

2. The vehicle of claim 1, wherein the first direction is substantially parallel to a direction of travel of the vehicle.

3. The vehicle of claim 1, wherein the lighting device further includes one or more collimators disposed on one or more of the plurality of light emitting diodes.

4. The vehicle of claim 1, wherein the plurality of light emitting diodes are arranged in a two-dimensional array.

5. The vehicle of claim 1, wherein the lighting device further includes one or more structural fibers that are at least partially disposed on the substrate.

6. The vehicle of claim 1, wherein a pitch of the stair step pattern is determined based on an angle of the back glass.

7. The vehicle of claim 1, wherein the back glass is formed by placing the lighting device into a mold and encasing the lighting device in a transparent material that is injected into the mold.

8. The vehicle of claim 1, wherein the lighting device is a high mounted stop lamp.

9. A lighting device for a vehicle, the lighting device comprising:
   a substrate;
   a plurality of light emitting diodes disposed on the substrate;
   a contact pad configured to receive electrical power; and
   a plurality of electrical connections disposed within the substrate that are configured to transmit electrical power from the contact pad to the plurality of light emitting diodes,
   wherein the plurality of light emitting diodes are configured to emit light in a first direction that is not normal to an outer surface of a back glass of the vehicle,
   wherein the substrate is formed into a stair step pattern,
   wherein the lighting device is disposed within th eback glass between an inner piece of glass and an outer glass that together form the back glass.

10. The lighting device of claim 9, further comprising one or more structural fibers that are at least partially disposed on the substrate.

11. The lighting device of claim 9, wherein a pitch of the stair step pattern is determined based on an angle of the back glass.

12. The lighting device of claim 9, wherein the first direction is substantially parallel to a direction of travel of the vehicle.

13. The lighting device of claim 9, further comprising one or more collimators disposed on one or more of the plurality of light emitting diodes.

14. The lighting device of claim 9, wherein the plurality of light emitting diodes are arranged in a two-dimensional array.

15. A vehicle comprising:
   a back glass disposed on a rear of the vehicle, wherein the back glass is angled such that the back glass is not perpendicular to a direction of travel of the vehicle;
   a lighting device disposed within the back glass between an inner piece of glass and an outer piece of glass that together form the back glass, wherein the lighting device comprises:
   a substrate having a stair step shape;
   a plurality of light emitting diodes disposed on the substrate;
   one or more collimators disposed on one or more of the plurality of light emitting diodes;
   a contact pad configured to receive electrical power; and
   a plurality of electrical connections disposed within the substrate that are configured to transmit electrical power from the contact pad to the plurality of light emitting diodes,
   wherein the plurality of light emitting diodes are configured to emit light in a first direction that is not normal to an outer surface of the back glass.

16. The vehicle of claim 15, wherein a pitch of the stair step shape is determined based on an angle of the back glass.

17. The vehicle of claim 15, wherein the lighting device further comprising one or more structural fibers that are at least partially disposed on the substrate.

18. The vehicle of claim 15, wherein the back glass is formed by placing the lighting device in between the inner piece of glass and the outer piece of glass.

19. The vehicle of claim 15, wherein the plurality of light emitting diodes are arranged in a two-dimensional array.

20. The vehicle of claim 15, wherein the first direction is substantially parallel to a direction of travel of the vehicle.

* * * * *